United States Patent
Tsai et al.

(10) Patent No.: US 7,105,424 B2
(45) Date of Patent: Sep. 12, 2006

(54) METHOD FOR PREPARING ARYLPHOSPHONITE ANTIOXIDANT

(75) Inventors: Yu-Pen Tsai, Kaohsiung (TW); Kuo-Pin Yang, Kaohsiung (TW); Wu-Chung Chiang, Kaohsiung (TW)

(73) Assignee: Advanced Semiconductor Engineering, Inc., Kaoshiung (TW)

( * ) Notice: Subject to any disclaimer, the term of this patent is extended or adjusted under 35 U.S.C. 154(b) by 0 days.

(21) Appl. No.: 10/983,619

(22) Filed: Nov. 9, 2004

(65) Prior Publication Data
US 2005/0142837 A1 Jun. 30, 2005

(30) Foreign Application Priority Data
Dec. 26, 2003 (TW) .............................. 92137201 A

(51) Int. Cl.
*H01L 21/78* (2006.01)
(52) U.S. Cl. ................. 438/464; 438/460; 438/113; 438/459; 438/E21.503
(58) Field of Classification Search .................. None
See application file for complete search history.

(56) References Cited

U.S. PATENT DOCUMENTS

| | | | |
|---|---|---|---|
| 6,794,751 B1 * | 9/2004 | Kumamoto | 257/738 |
| 6,841,413 B1 * | 1/2005 | Liu et al. | 438/106 |
| 2002/0001688 A1 | 1/2002 | Ueda et al. | |
| 2003/0034128 A1 | 2/2003 | Matsumura et al. | |
| 2004/0185601 A1 * | 9/2004 | Stepniak et al. | 438/108 |

* cited by examiner

*Primary Examiner*—Dung A. Le
(74) *Attorney, Agent, or Firm*—Bacon & Thomas, PLLC

(57) ABSTRACT

A method for forming an underfill layer on a bumped wafer is disclosed. A film is provided wherein the film includes a base layer, a removable layer and the underfill layer. The film is disposed on a bump wafer and then pressing the film under heating is performed to have the bumps of the wafer embedded in the underfill layer. Then, the removable layer with base film attached thereto is removed, so the underfill layer well encloses the bumps of the wafer and is easily separated from the base film layer and the removable layer without damaging the bumps formed on the wafer.

20 Claims, 3 Drawing Sheets

METHOD FOR PREPARING ARYLPHOSPHONITE ANTIOXIDANT

BACKGROUND OF THE INVENTION

1. Field of Invention

This invention relates to a method of forming an underfill layer on a bumped wafer. More particularly, the present invention is related to a method of forming an underfill layer on a bumped wafer, which further comprises the step of grinding wafer.

2. Related Art

In this information explosion age, integrated circuits products are used almost everywhere in our daily life. As fabricating technique continue to improve, electronic products having powerful functions, personalized performance and a higher degree of complexity are produced. Nowadays, most electronic products are relatively light and have a compact body. Hence, in semiconductor production, various types of high-density semiconductor packages have been developed. Flip chip is one of the most commonly used techniques for forming an integrated circuits package. Moreover, compared with a wire-bonding package or a tape automated bonding (TAB) package, a flip-chip package uses a shorter electrical path on average and has a better overall electrical performance. In a flip-chip package, the bonding pads on a chip and the contacts on a substrate are connected together through a plurality of bumps formed on the chip by a conventional bumping process and then an underfill material is filled into the gap between the chip and the substrate to encapsulate the bumps so as to well protect the bumps. In such a manner, the reliability of such flip chip package is enhanced.

As mentioned above, in a flip chip package, there is usually provided an underfill material between the substrate and the chip so as to enhance the reliability of the packaging products. In a conventional method, the underfill is dispensed at the peripheral of the chip or disposed through an opening of the substrate so as to be filled in the gap between the substrate and the chip. Hence, the bumps of the chip between the chip and the substrate are enclosed by the underfill material. However, this method usually spends a lot of time and causes a lot of voids in the underfill layer.

As disclosed in U.S. Publications 2002/0001688 and 2003/0034128, there is disclosed a wafer level packaging method. Therein, an underfill layer is preformed on a film and then the underfill layer with the film formed thereon is disposed on the bumped wafer and then a pressing and heating process is performed so as to have the underfill layer enclosing the bumps. Afterwards, the bumped wafer with the underfill layer formed thereon is singulated into a plurality of chips. However, the bumps are easy to be damaged when the underfill layer is pressing and heating. In addition, the film is not easy to be removed from the underfill layer. Besides, the process of grinding the backside of the wafer is not easy performed due to not enough protection for the bumps.

Therefore, providing another method to solve the mentioned-above disadvantages is the most important task in this invention.

SUMMARY OF THE INVENTION

In view of the above-mentioned problems, an objective of this invention is to provide a method of forming an underfill layer on a bumped wafer by utilizing a film having a base layer, a removable layer and an underfill layer and performing a process of pressing the film under heating on a bumped wafer to have the bumps embedded in the underfill layer. Thus, the bumps of the bumped wafer can be well protected when the grinding process is performed and the removable layer is removed. In addition, the removable layer with the base layer attached thereto is easy to be removed from the underfill layer so as to protect the bumps from being damaged. Moreover, the removable layer is regarded as a buffer layer to well protect the bumps from being damaged when the process of grinding back surface of the wafer is performed.

To achieve these and other advantages and in accordance with the purpose of the invention, as embodied and broadly described herein, the invention specifically provides a method of forming an underfill layer on a bumped wafer. The method mainly comprises providing a wafer having an active surface with a plurality of bumps formed thereon and a back surface, providing a film having a base layer, an underfill layer and a removable layer interposed between the base layer and the underfill layer, disposing the film on the bumps, pressing the film onto the film under heat so as to have the bumps embedded into the underfill layer. Preferably, after the process of pressing the film on the bumps under heating is performed, there is further performed a process of grinding the back surface of the wafer to thin the wafer. Then, the removable layer is removed by performing a light radiation on the removable layer, heating the removable layer, cooling the removable layer or decomposing the removable layer through a solution, such a chemical solution, so as to have the removable layer easily removed from the underfill layer.

It is to be understood that both the foregoing general description and the following detailed description are exemplary, and are intended to provide further explanation of the invention as claimed.

BRIEF DESCRIPTION OF THE DRAWINGS

The invention will become more fully understood from the detailed description given herein below illustrations only, and thus are not limitative of the present invention, and wherein.

DETAILED DESCRIPTION OF THE INVENTION

Figure 1:
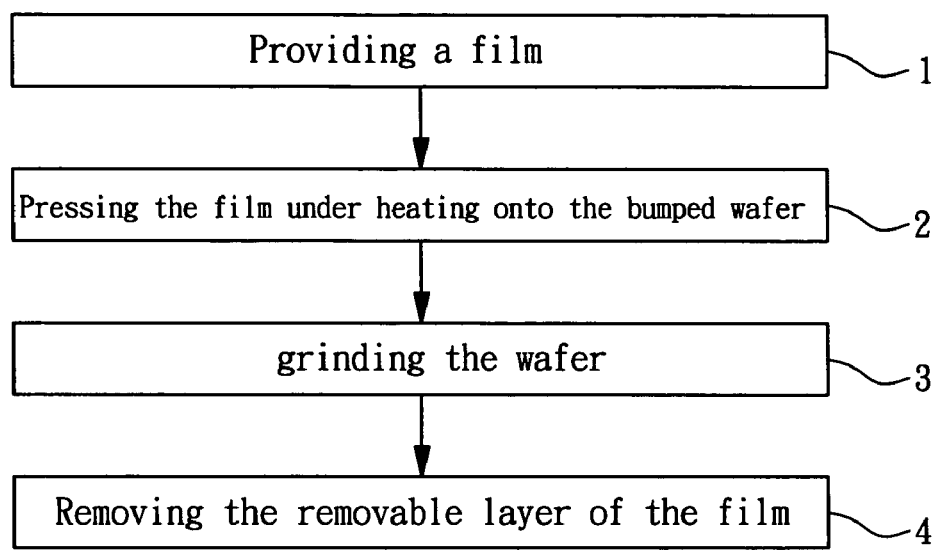
FIG. 1 is a flow chart illustrating the process flow of a method of dicing a wafer according to the preferred embodiment of this invention.

The forming method thereof according to the preferred embodiment of this invention will be described herein below with reference to the accompanying drawings, wherein the same reference numbers are used in the drawings and the description to refer to the same or like parts.

As shown in FIG. 1, it illustrates a process flow of a method of forming an underfill layer on a wafer. The method mainly comprises the following steps of providing a film as shown in step 1, disposing the film on the wafer and then pressing the film on the bumps under heating as shown in step 2, grinding the back surface of the wafer as shown in step 3, and removing the removable layer of the film form the wafer so as to leave the underfill layer enclosing the bumps as shown in step 4. However, the step 3 is optional.

Figure 2:
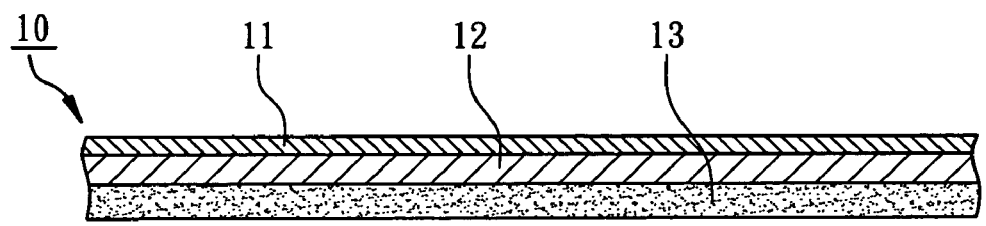
FIGS. 2 to 7 are partially enlarged cross-sectional views showing the progression of steps of dicing a wafer according to the preferred embodiment of this invention.

Referring to FIG. 2, it illustrates the step 1. Therein, the film 10, such as a grinding film, has a base layer 11, a removable layer 12 and an underfill layer 13, and the removable layer 12 is interposed between the base layer 11 and the underfill layer 13. Besides, the base layer 11 can be made of a flexible material or a rigid material, for example PET, polyester, Ethylene Vinyl Acetate and the combination thereof, the removable layer 12 can be made of an adhesive epoxy layer with flexible material contained therein, which may be selected from thermal activated adhesive, such as thermoplastic resin, photo-resist, photosensitive resin and ultraviolet (UV) tape or epoxy and the combination thereof. To be noted, the removable layer 12 is made of a material with the adhesion can be changed, erased, or reduced during the processing steps so as to be regarded as an impermanently interposed layer. In this embodiment, the removable layer 12 can be reacted by performing a light radiation, heat, chemical solutions or other decomposition material to reduce the adhesion. In another embodiment, the removable layer 12 has an adhesive layer and a reaction layer (not shown), and the reaction layer of the removable layer 12 can be decomposed under the decomposition process as mentioned above, such as performing a light radiation on the reaction layer, performing a heating process on the reaction layer and disposing the reaction layer in a decomposition solution. Therein, the reaction layer of the removable layer 12 is adhered to the underfill layer 13 and the adhesive layer of the removable layer 12 is adhered to the base layer 11. In addition, the underfill layer 13 may be made of B-stage.

Figure 3:
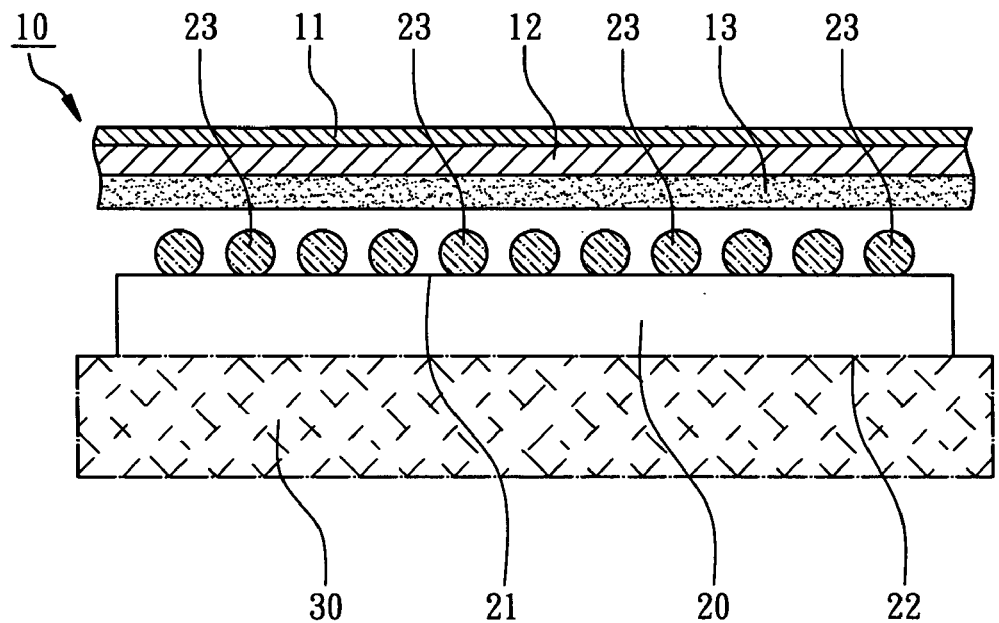
Figure 4:
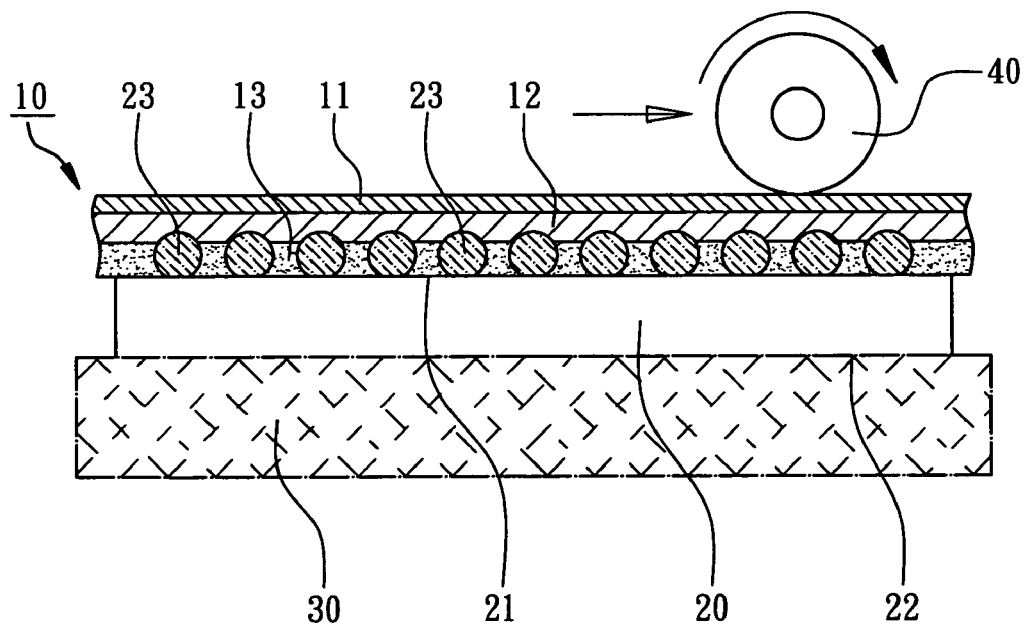

Afterwards, referring to FIG. 3, it illustrates the step 2 of disposing a film 10 on the wafer 20 and pressing the film 10 onto the bumped wafer 20 under heating. Therein, a bumped wafer 20 is provided, wherein the bumped wafer 20 has an active surface 21 and a back surface 22, and the active surface 21 has a plurality of bumps 23 formed thereon, for example gold bumps, solder bumps and copper bumps. Preferably, the bumps 23 are reflowed to be affixed to the bumped wafer 20. Besides, there are under bump metallurgy layers (not shown) formed between the bumps 23 and the active surface 21 of the bumped wafer 20. In addition, in the step 2, the wafer 20 is disposed on a heater 30 so as to have the back surface 22 of the bumped wafer 20 contacted to the heater 30. Therefore, the heater 30 can transfer the heat to the underfill layer 13 of the film 10 when the film 10 is disposed on the bumped wafer 20. Next, referring to FIG. 4, a roller 40 is utilized to press the film 10 onto the bumped wafer 20 under heating so as to have the bumps 23 to be embedded in the underfill layer 13. Preferably, the bumps 23 are contacted to the removable layer 12. Thus, the underfill layer 13 of the film 10 is adhered to the active surface 21 of the bumped wafer 20 and the bumps 23 are enclosed by the underfill layer 13 so as to be well protected from being damaged.

Figure 5:
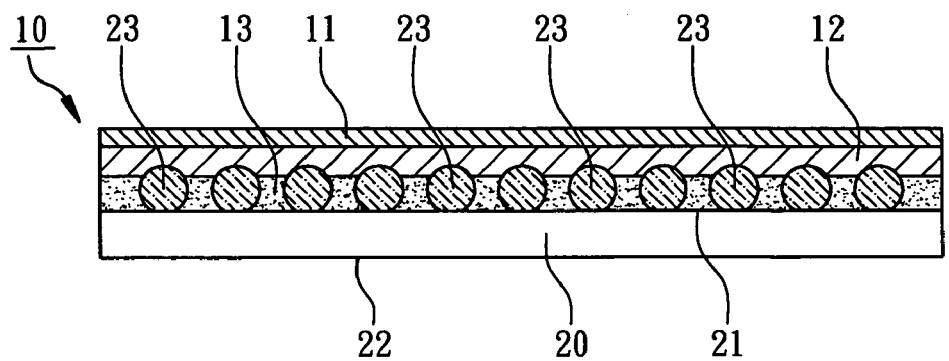

Next, Referring to FIG. 5, it illustrates the step 3 of grinding the back surface 22 of the wafer 20 after the heater 30 is removed. Therein, the back surface 22 of the wafer 20 are faced to a grinding tool (not shown) so as to thin the thickness of the wafer 20 by grinding the back surface 22 of the wafer 20. As shown in FIG. 5, the bumps 23 are enclosed by the underfill layer 13 and protected by the removable layer 12 so as to prevent the wafer 20 from being damaged at the step of grinding the back surface 22 of the bumped wafer 20 and the following procedure of removing the film 10 as shown in FIG. 6.

Figure 6:
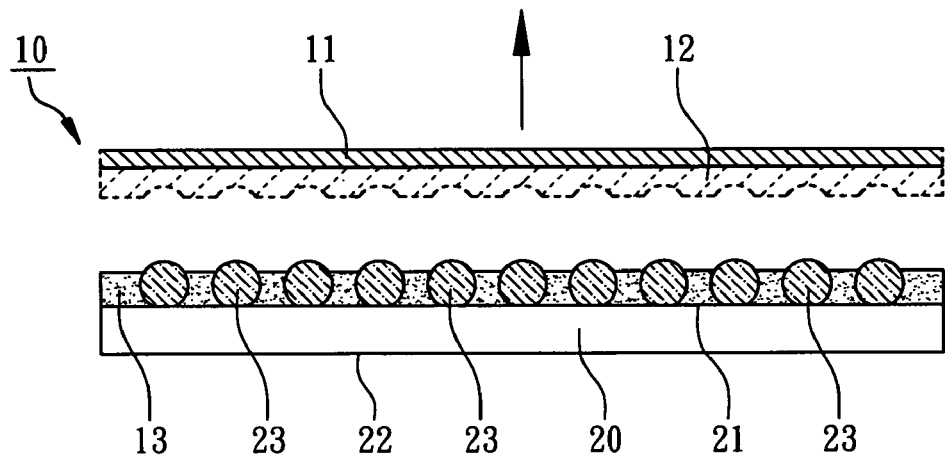

Afterwards, referring to FIG. 6, it illustrates the step 4 of removing the film 10 by decomposing the removable layer 12. Therein, removing the removable layer 12 of the film 10 can be performed by utilizing the methods of performing a light radiation on the removable layer 12, heating and cooling on the removable layer 12, and disposing the removable layer 12 in a decomposition solution so as to decompose the removable layer 12 or reduce the adhesion of the removable layer 12 to the underfill layer 13. Hence, the underfill layer 13 is easily separated from the base layer 11 and the removable layer 12. In other words, when the adhesion of the removable layer 12 to the underfill layer 13 is smaller than the adhesion of the removable layer 12 to the base layer 11, the removable layer 12 will be adhered to the base layer 11 of the film 10 or decomposed at the process. Hence, the underfill layer 13 will be easily adhered to the bumped wafer 20 and separated from the base layer 11 of the film 10 without causing the bumps 23 to be damaged. To be noted, the underfill layer 13 is partially solidified after the removable layer 12 and the base layer 11 are removed from the underfill layer 13. In addition, the area of the film 10 is substantially the same with the area of the active surface 21 of the bumped wafer 10.

Figure 7:
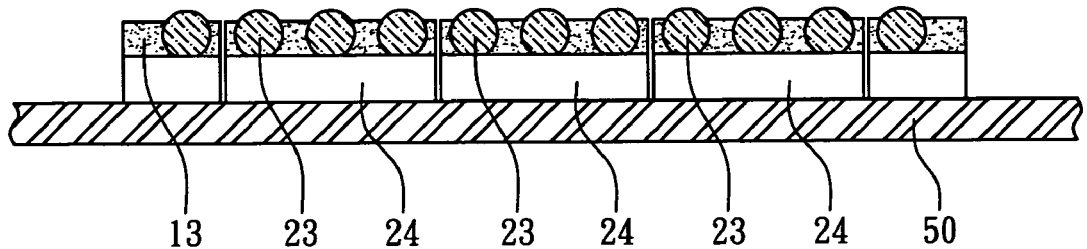

Referring to FIG. 7, after the step 4 of removing the removable layer 12 and the base layer 11 of the film 10, the step of attaching a sawing tape 50 on the back surface 22 of the bumped wafer 20 can be performed so as to continuously process the following step of singulating the bumped wafer 20 into a plurality of chips 24. Therein, the sawing tape 50 can be an ultraviolet (UV) tape which can be easily removed from the chips 24 after performing a light radiation on the sawing tape 50. Because the underfill layer 13 covers the bumps 23 formed on the active surface 21 of the chips 24, it is unnecessary to dispense another underfill in the gap between the chip and a substrate when such chip 24 with bumps 23 is attached to the substrate to form a flip chip package.

Thus, as shown above, this invention is mainly to provide a film 10 having a base layer 11, a removable layer 12, and an underfill layer 13. Therein, the removable layer 12 is interposed between the underfill layer 13 and the base layer 11. After the film 10 is pressed on to the wafer 20 under heating to have the underfill layer 13 adhered to the active surface 21 of the bumped wafer 20 and covering the bumps 23. Next, a grinding process is performed and a process of reducing the adhesion of the removable layer 12 to the underfill layer 13 is performed by the method of performing a light radiation or heating on the removable layer 12 to separate the removable layer 12 and the base layer 11 of the film 10 from the bumped wafer 20. Hence, the underfill layer 13 can be efficiently adhered to the active surface 21 with the bumps 23 formed thereon and separated from the removable layer 12 and the base layer 11 of the film 10. Furthermore, the bumps 23 will be well protected at the steps of grinding the back surface 22 of the bumped wafer 20 and adhering the underfill layer to the bumps 23.

Although the invention has been described in considerable detail with reference to certain preferred embodiments, it will be appreciated and understood that various changes and modifications may be made without departing from the spirit and scope of the invention as defined in the appended claims.

What is claimed is:

1. A method of forming an underfill layer on a bumped wafer, the method comprising the steps of:
   providing a film having a base layer, a removable layer and an underfill layer, wherein the removable layer is interposed between the base layer and the underfill layer;

disposing the film on the bumped wafer wherein the bumped wafer has an active surface and a back surface, and the active surface has a plurality of bumps formed thereon;

pressing the film onto the bumps so that the bumps are embedded into the underfill layer; and removing the removable layer with the base layer attached thereto from the underfill layer at the same time so as to leave the underfill layer on the bumped wafer and remove the base layer away from the bumped wafer.

2. The method of claim 1, wherein when the step of pressing the film onto the bumps is performed, there is further performed a step of heating the film.

3. The method of claim 2, wherein the step of pressing the film onto the bumps is simultaneously performed with the step of heating the film.

4. The method of claim 1, further comprising a grinding process of grinding the back surface of the wafer after the process of pressing the film onto the bumps is performed.

5. The method of claim 1, wherein the removable layer is an adhesive epoxy layer.

6. The method of claim 1, wherein the removable layer comprises a buffer layer.

7. The method of claim 1, wherein the removable layer is made of a material selected from a thermoplastic resin, a photosensitive resin and a thermal activated adhesive.

8. The method of claim 1, wherein the removable layer is an ultraviolet tape.

9. The method of claim 1, wherein the removable layer is a photo-resist layer.

10. The method of claim 1, wherein the step of removing the removable layer from the underfill layer comprises performing a light radiation on the removable layer, heating the removable layer, cooling the removable layer and decomposing the removable layer through a solution.

11. The method of claim 1, wherein the underfill layer is partially solidified after removing the removable layer.

12. The method of claim 1, wherein the area of the film is substantially the same with the area of the active surface of the wafer.

13. The method of claim 1, wherein the bumps are solder balls.

14. The method of claim 1, wherein the film is a grinding film.

15. A method of forming an underfill layer on a bumped wafer, the method comprising the steps of:

providing a film having a base layer, a removable layer and an underfill layer, wherein the removable layer is interposed between the base layer and the underfill layer;

disposing the film on the bumped wafer wherein the bumped wafer has an active surface and a back surface, and the active surface has a plurality of bumps formed thereon;

pressing the film onto the bumps so that the bumps are embedded into the underfill layer; and removing the removable layer with the base layer attached thereto from the underfill layer so as to leave the underfill layer on the bumped wafer and remove the base layer away from the bumped wafer, wherein the removable layer is made of a material selected from a photosensitive resin and a thermal activated adhesive.

16. The method of claim 15, further comprising a grinding process of grinding the back surface of the wafer after the process of pressing the film onto the bumps is performed.

17. The method of claim 15, wherein the step of removing the removable layer from the underfill layer comprises performing a light radiation on the removable layer, heating the removable layer, cooling the removable layer and decomposing the removable layer through a solution.

18. A method of forming an underfill layer on a bumped wafer, the method comprising the steps of:

providing a film having a base layer, a removable layer and an underfill layer, wherein the removable layer is interposed between the base layer and the underfill layer;

disposing the film on the bumped wafer wherein the bumped wafer has an active surface and a back surface, and the active surface has a plurality of bumps formed thereon;

pressing the film onto the bumps so that the bumps are embedded into the underfill layer; and removing the removable layer with the base layer attached thereto from the underfill layer so as to leave the underfill layer on the bumped wafer and remove the base layer away from the bumped wafer, wherein the step of removing the removable layer from the underfill layer comprises performing a light radiation on the removable layer, heating the removable layer, cooling the removable layer and decomposing the removable layer through a solution.

19. The method of claim 18, further comprising a grinding process of grinding the back surface of the wafer after the process of pressing the film onto the bumps is performed.

20. The method of claim 18, wherein the removable layer is made of a material selected from a photosensitive resin and a thermal activated adhesive.

* * * * *

UNITED STATES PATENT AND TRADEMARK OFFICE
CERTIFICATE OF CORRECTION

PATENT NO. : 7,105,424 B2 Page 1 of 1
APPLICATION NO. : 10/983619
DATED : September 12, 2006
INVENTOR(S) : Yu-Pen Tsai et al.

It is certified that error appears in the above-identified patent and that said Letters Patent is hereby corrected as shown below:

On Title page item 54 and Col. 1 - Line 1
The Title of the Invention is amended to read:

--METHOD FOR FORMING AN UNDERFILL LAYER ON A BUMPED WAFER--

Signed and Sealed this

Fourteenth Day of November, 2006

JON W. DUDAS
*Director of the United States Patent and Trademark Office*